United States Patent
Subramani et al.

(10) Patent No.: US 9,018,995 B2
(45) Date of Patent: Apr. 28, 2015

(54) INTEGRATED CLOCK GATING CELL FOR CIRCUITS WITH DOUBLE EDGE TRIGGERED FLIP-FLOPS

(75) Inventors: Kumar Subramani, Redwood City, CA (US); Radu Zlatanovici, Oakland, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 838 days.

(21) Appl. No.: 12/630,260

(22) Filed: Dec. 3, 2009

(65) Prior Publication Data

US 2011/0133806 A1 Jun. 9, 2011

(51) Int. Cl.
*H03K 3/00* (2006.01)
*H03K 3/356* (2006.01)
*H03K 3/012* (2006.01)

(52) U.S. Cl.
CPC .......... *H03K 3/356156* (2013.01); *H03K 3/012* (2013.01)

(58) Field of Classification Search
CPC . H03K 3/35625; H03K 3/012; H03K 3/0375; H03K 3/356121; H03K 3/356156
See application file for complete search history.

(56) References Cited

U.S. PATENT DOCUMENTS

| | | | |
|---|---|---|---|
| 6,137,331 A | 10/2000 | Peset Llopis | |
| 6,300,809 B1 | 10/2001 | Gregor et al. | |
| 6,750,693 B1 * | 6/2004 | Duewer | 327/298 |
| 6,876,185 B2 * | 4/2005 | Niratsuka | 324/76.53 |
| 7,102,446 B1 * | 9/2006 | Lee et al. | 331/11 |
| 7,109,776 B2 | 9/2006 | Tschanz et al. | |
| 7,562,316 B2 * | 7/2009 | Tschanz et al. | 716/120 |
| 7,680,238 B2 * | 3/2010 | Lin | 377/47 |
| 7,816,950 B2 * | 10/2010 | Miyazaki | 326/93 |
| 2006/0103557 A1 | 5/2006 | Padaparambil | |
| 2008/0074151 A1 | 3/2008 | Kim | |
| 2009/0256593 A1 | 10/2009 | Naffziger | |
| 2010/0148836 A1 | 6/2010 | Zlatanovici | |

OTHER PUBLICATIONS

Afghani, M. et al., "Double Edge-Triggered D-Flip-Flops for High-Speed CMOS Circuits", IEEE Journal of Solid-State Circuits, Aug. 1991, vol. 26, No. 8, pp. 1168-1170.

Nedovic, N. et al., "Dual-Edge Triggered Storage Elements and Clocking Strategy for Low-Power Systems", IEEE Transactions on Very Large Scale Integration (VLSI) Systems, May 2005, vol. 13, No. 5, pp. 577-590.

Pedram, M. et al., "A New Design of Double Edge Triggered Flip-flops", 1998, IEEE, pp. 417-421.

(Continued)

*Primary Examiner* — Sibin Chen
(74) *Attorney, Agent, or Firm* — Holland & Knight LLP; Mark H. Whittenberger, Esq.

(57) ABSTRACT

A double edge triggered circuit includes a clock gater responsive to a clock signal and an enable signal to output a gated clock signal, a first double edge triggered flip-flop that launches a data signal in response to the gated clock signal, and a second double edge triggered flip-flop that captures the data signal in response to the clock signal, wherein the clock gater stops the gated clock signal at a first logic value when the enable signal is at a first logic state, and the clock gater switches the gated clock signal from the first logic value at a next clock edge when the enable signal is at a second logic state.

17 Claims, 8 Drawing Sheets

(56) References Cited

OTHER PUBLICATIONS

International Search Report, Application No. PCT/US2010/058650, dated Feb. 2, 2011, pp. 1-4.

Notification Concerning Transmittal of International Preliminary Report on Patentability and Written Opinion of the International Searching Authority in Application No. PCT/US2010/058650, mailed Jun. 14, 2012 (8 pages).

* cited by examiner

INTEGRATED CLOCK GATING CELL FOR CIRCUITS WITH DOUBLE EDGE TRIGGERED FLIP-FLOPS

BACKGROUND OF THE INVENTION

1. Field of the Invention

The embodiments of the invention relate to a semiconductor device, and more particularly, to a clock gating cell. Although embodiments of the invention are suitable for a wide scope of applications, it is particularly suitable for gating a clock signal in circuits having double edge triggered flip-flops.

2. Discussion of the Related Art

In general, synchronous digital systems use a clock signal to coordinate data movement within the system. Early digital systems coordinated the movement of data on either a rising or falling edge of the clock signal and were known as single edge triggered (SET). A single edge triggered flip-flop loads data provided at an input thereof on one of the rising and falling edge of the clock signal.

The components of a related art digital system include transistors that change state at each clock signal. When a component changes state, it consumes power. However not all state changes of the component are necessary to the proper function of the digital system. A component of a digital system may respond to a clock signal and change states thus losing power at a time period when its output is not being used by the system. Unnecessary state changes cause inefficiency because of energy loss is in the form of heat.

The related art digital system may use a clock gating technique to reduce power consumption and prevent individual logic devices from switching states when not in use. When a clock signal is gated prior to being inputted to a logic device, the gated clock signal does not cause the logic device to change state. Clock gating effectively disables the logic device during a time period when the logic device is not needed for the current operation of the digital circuit.

FIG. 1 is a schematic diagram of an integrated clock gating cell (ICG) according to the related art. Referring to FIG. 1, the ICG consists of an AND gate 100. The ICG 100 responds to an enable signal 120 and a clock signal 110 to provide a gated clock signal 130. The clock signal 130 is a switching signal that can be used to synchronize devices in the synchronous digital circuit. The enable signal 120 is controlled by external logic and toggles from low to high to enable the gated clock signal 130. When both the enable signal 120 and the clock signal 110 are high, the gated clock signal 130 is high. When the enable signal 120 is low, the gated clock signal 130 remains low.

Thus, in the related art ICG 100 of FIG. 1, the gated clock signal 130 tracks the clock signal 110 when the enable signal 120 is high. In contrast, when the enable signal 120 is low, the gated clock signal 130 remains low in spite of the transitions in the clock signal 110. However, the related art ICG 100 of FIG. 1 causes a glitch on the enable signal 120 while the clock signal 110 is high to propagate to the connected components through to the gated clock signal 130, thereby causing incorrect data to be loaded in the components clocked by the gated clock signal 130.

FIG. 2 is a schematic diagram of another related art ICG for use in a SET system. Referring to FIG. 2, the related art ICG 200 includes an AND gate 210 and a latch 220 of opposite polarity (i.e. negative latch for rising edge triggered systems and positive latch for falling edge triggered systems) to eliminate glitches. A clock signal 230 is provided to a first input of the latch 220 and to a first input of the AND gate 210. An enable signal 240 is provided at a second input of the latch 220 and the output from the latch 220 is provided to a second input of the AND gate 210. The output from the AND gate 210 is a gated clock signal 250.

According to the related art ICG 200 of FIG. 2, for rising edge triggered systems, the latch 220 is used to remove any glitching from the gated clock output 250. While the clock signal 230 is high or at logic 1, the latch 220 is not transparent, and any glitch on the enable input 240 does not propagate to the output 250 of the ICG 200. While the clock signal 230 is low or at logic 0, the latch 220 is transparent and any glitch propagating through the latch is stopped at the AND gate 210.

According to the related art ICG 200 of FIG. 2, for rising edge triggered systems, the gated clock signal is gated at logic zero i.e. the gated clock signal 250 remains at logic zero if the enable signal 240 remains at "0" for a long enough time. Similarly, the gated clock signal 250 is gated at logic one for falling edge triggered systems.

However, the related art ICG 200 of FIG. 2 uses a SET flip-flop so that data can be loaded only on one of the rising edge and the falling edge of the clock signal 230. To achieve higher data loading rate, it is desirable to load data on both edges of the clock signal.

To reduce power consumption, recent digital systems use double edge triggered (DET) flip-flops to coordinate data movement between components of the system. A DET flip-flop loads data both at the rising and at the falling edge of the clock signal. These benefits are realized because data can be loaded on both edges of the clock signal rather than only one, hence the same functionality and throughput can be obtained at half the clock frequency.

In a double edge triggered circuit, the rising edges of the clock and the falling edges of the clock signal are functionally equivalent (both cause data to be loaded in the flip-flops). From a purely functional perspective, rising clock edges and falling clock edges are mutually interchangeable. Clock gating can be rethought in terms of clock edges in general, without reference to the rising or falling direction of particular edges: when the clock is gated, there are no clock edges. When the clock is enabled, there are edges in the output clock regardless of their direction. Despite the benefits of DET systems, they are infrequently employed because of their incompatibility with the related art clock gating cells, one of the most common and widely used low power techniques.

FIG. 3 is a timing diagram illustrating the switching of a gated clock signal by the related art ICG cell of FIG. 2 when used in a system with DET flip-flops. Referring to FIG. 3, the clock signal 230 provided at the first input of the ICG 200 switches periodically between logic zero and logic one. For example, the clock signal 230 switches from low to high with a rising edge 231 following a time t=0 and switches back to low with a falling edge 232 prior to a time t=1. The switching of the clock signal 230 repeats periodically over time as shown in FIG. 3.

The enable signal 240 at logic 1 prior to the time t=0 and remaining at logic 1 in the time interval from t=0 to t=1 enables the related art ICG 200 to output the gated clock signal 250. Thus, the gated clock signal 250 follows the clock signal 230 in the time interval from t=0 to t=1 with a rising edge 251 following the rising edge 231 of the clock signal 230 and a falling edge 252 following the falling edge 232 of the clock signal.

At a time t=1, the enable signal 240 is switched to low with a falling edge 242 and remains low until a time t=2. Thus, during the time between t=1 and t=2, the related art ICG 200 gates the clock signal at a low value in accordance with the state of the gated clock signal 250 at time t=1.

At time t=2 shortly after a rising edge 235 of the clock signal 230, the enable signal 240 is switched back to high with a rising edge 243. The gated clock 250 is enabled by the high level of the enable signal 240 and starts following the clock signal. However, the rising edge 253 of the gated clock signal 250 occurs after a time delay after the rising edge 243 of the enable signal 240, thus much later than the corresponding rising edge 235 of the clock signal. Thereafter, the gated clock signal 250 switches in accordance with the clock signal 230. For example, the next falling edge 254 of the gated clock signal 254 occurs shortly after the falling edge 236 of the clock signal 230.

However, because the first transition of the gated clock signal 250 with the rising edge 253 occurs much later than the corresponding rising edge 235 of the clock signal, the first pulse from the rising edge 253 to the falling edge 254 of the gated clock signal 250 is much narrower than the pulse width of the clock signal 230. This irregular pulse may cause erroneous behavior in the synchronous digital system. For example, components such as DET flip-flops might incorrectly be switched by the gated clock 250 to load data in the middle of the clock cycle.

A similar incorrect switching of the DET flip-flops can be observed when the ICG 200 stops the gated clock at logic high.

It is desirable for the gated clock signal 250 to start following the input clock after some delay following the rising edge 243 of the enable signal 240 while preserving the pulse width of the clock signal. However, when the related art ICG 200 is used in conjunction with DET flip-flops, the gated clock signal 240 incorrectly switches from low to high with a long delay after the rising edge 235 of the clock signal 230 but switches back to low shortly after the next falling edge 236 of the clock signal 230. Thus, the related art ICG is not suitable for reliably gating the clock signal for DET flip-flops.

SUMMARY OF THE INVENTION

Accordingly, embodiments of the invention are directed to an integrated clock gating cell for use in circuits with double edge triggered flip-flops that substantially obviates one or more of the problems due to limitations and disadvantages of the related art.

An object of embodiments of the invention is to provide an integrated clock gating cell for gating the clock signal in a digital circuit including double edge triggered flip-flops.

Another object of embodiments of the invention is to provide an integrated clock gating cell for reducing power consumption in a digital system including double edge triggered flip-flops.

Yet, another object of embodiments of the invention is to provide an integrated clock gating cell for reducing undesired switching in a digital system including double edge triggered flip-flops.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, a double edge triggered circuit includes a clock gater responsive to a clock signal and an enable signal to output a gated clock signal, a first double edge triggered flip-flop that launches a data signal in response to the gated clock signal, a second double edge triggered flip-flop that captures the data signal in response to the clock signal, wherein the clock gater stops the gated clock signal at a first logic value when the enable signal is at a first logic state, and the clock gater switches the gated clock signal from the first logic value at a next clock edge when the enable signal is at a second logic state.

In another aspect, a double edge triggered circuit includes a clock gater that outputs a control signal that switches at a first falling edge and a first rising edge of a clock signal following a rising edge of an enable signal and holds the control signal at a gated logic level following a falling edge of the enable signal, a first double-edge triggered flip-flop that launches a first data at a first rising edge of the control signal responsive to the first falling edge of the clock signal and launches a second data at a first falling edge of the control signal responsive to the first rising edge of the clock signal, and a second double-edge triggered flip-flop that loads the first data at the first rising edge of the clock signal and loads the second data at the next falling edge of the clock signal following to the first rising edge of the clock signal.

In another aspect, a method is provided for transferring data in a digital system including a T-type flip-flop responsive to a clock signal at the clock input thereof and an enable signal at the T input thereof to output a control signal, a first double edge triggered flip-flop controlled by the control signal, and a second double edge triggered flip-flop controlled by the clock signal. The method includes changing the enable signal from a low logic level to a high logic level to enable data transfer between the first and second double edge triggered flip-flops, switching the control signal at a first falling edge and a first rising edge of the clock signal following the changing of the enable signal from the low logic level to the high logic level, launching a first data from the first double-edge triggered flip-flop at a first rising edge of the control signal in response to the first falling edge of the clock signal, loading the first data into the second double-edge triggered flip-flop at the first rising edge of the clock signal, launching a second data from the first double-edge triggered flip-flop at a first falling edge of the control signal in response to the first rising edge of the clock signal, loading the second data into the second double-edge triggered flip-flop at the next falling edge of the clock signal following the first rising edge of the clock signal, changing the enable signal from the high logic level to the low logic level, and holding the control signal at a gated logic level following the changing of the enable signal from the high logic level to the low logic level to prevent data transfer between the first and second double edge triggered flip-flops.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of embodiments of the invention.

DETAILED DESCRIPTION OF THE PREFERRED EMBODIMENTS

Figure 1:
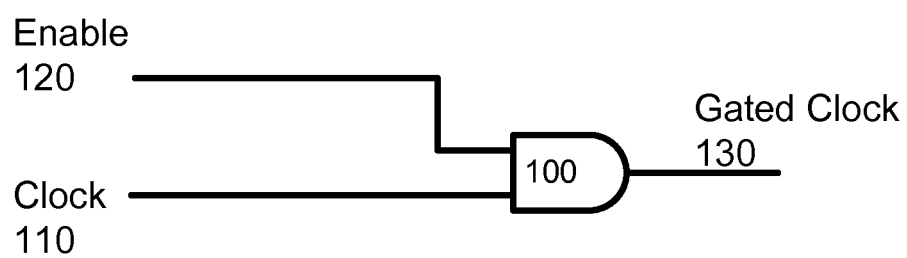
FIG. 1 is a schematic diagram of an integrated clock gating cell (ICG) according to the related art.
Figure 2:
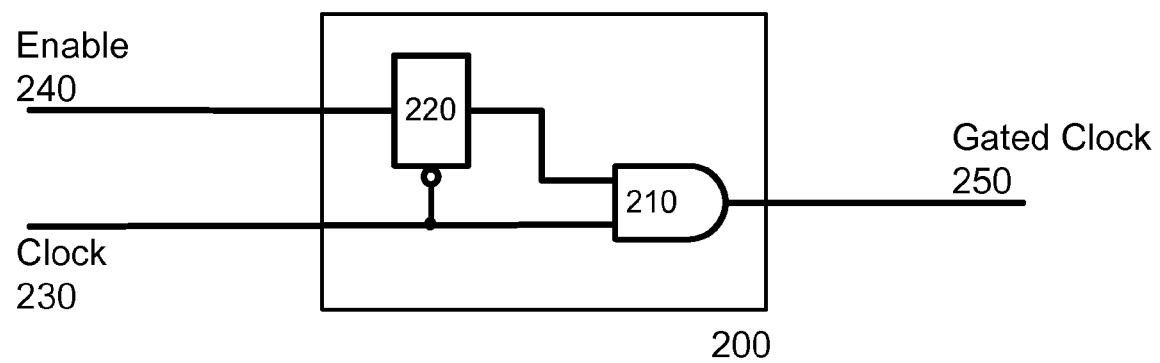
FIG. 2 is a schematic diagram of another related art ICG for use in a SET system.
Figure 3:
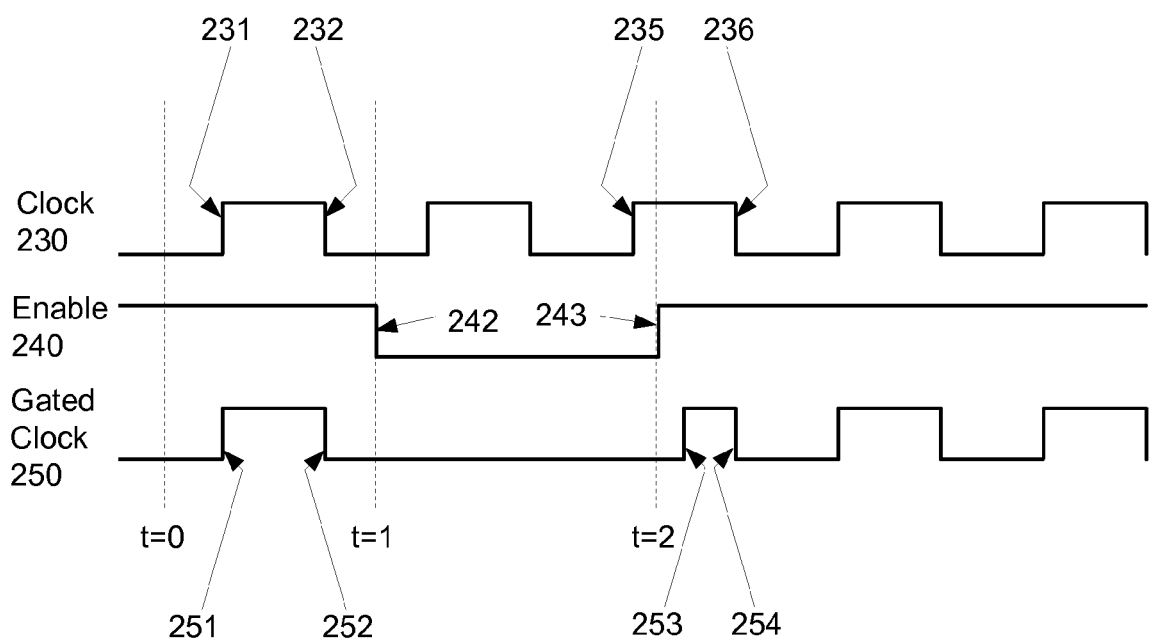
FIG. 3 is a timing diagram illustrating the switching of a gated clock signal by the related art ICG cell of FIG. 2 when used in a system with DET flip-flops.

Reference will now be made in detail to the preferred embodiments of the invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

Figure 4:
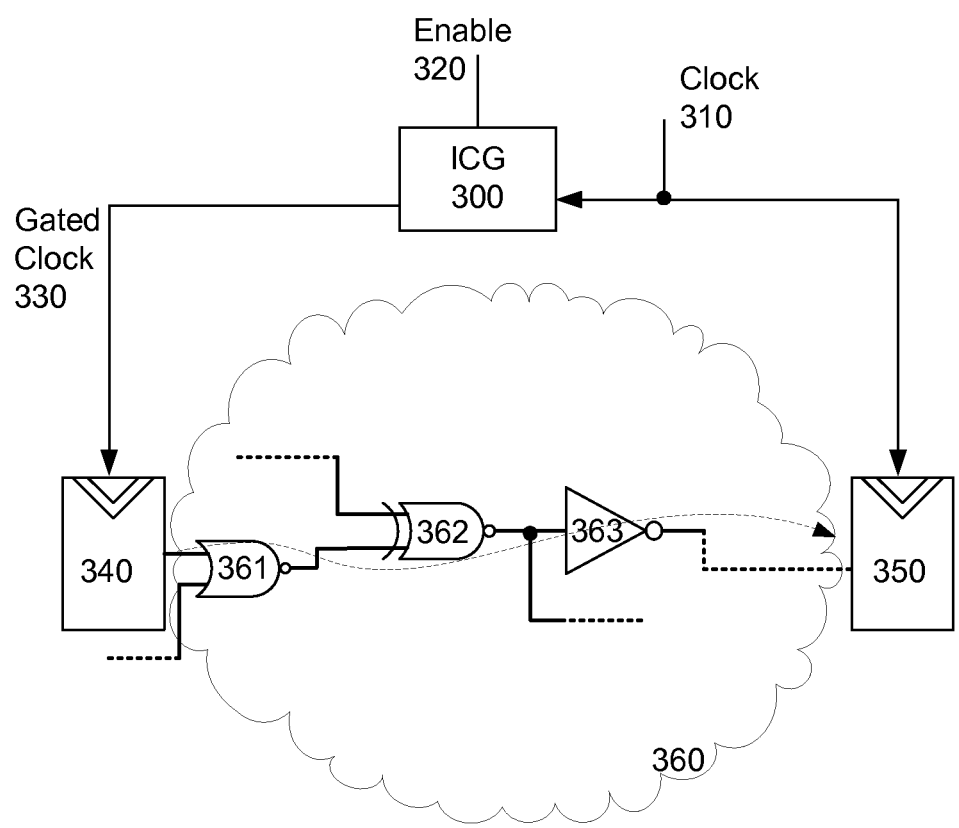
FIG. 4 is a schematic diagram of an exemplary ICG in a DET system according to an embodiment of the invention.

FIG. 4 is a schematic diagram of an exemplary ICG in a DET system according to an embodiment of the invention. Referring to FIG. 4, a DET system includes an ICG 300 that receives a clock signal 310 and outputs a gated clock signal 330 in response to an enable signal 320. The gated clock signal 330 from the ICG 300 is inputted to a first DET flip-flop 340 to control data transfer into and out of the first DET flip-flop 340. The first DET flip-flop 340 transfers data to a second DET flip-flop 350 via a combinational path 360 implementing a desired logic circuit. The second DET flip-flip 350 is clocked with the ungated clock signal 310.

Figure 5:
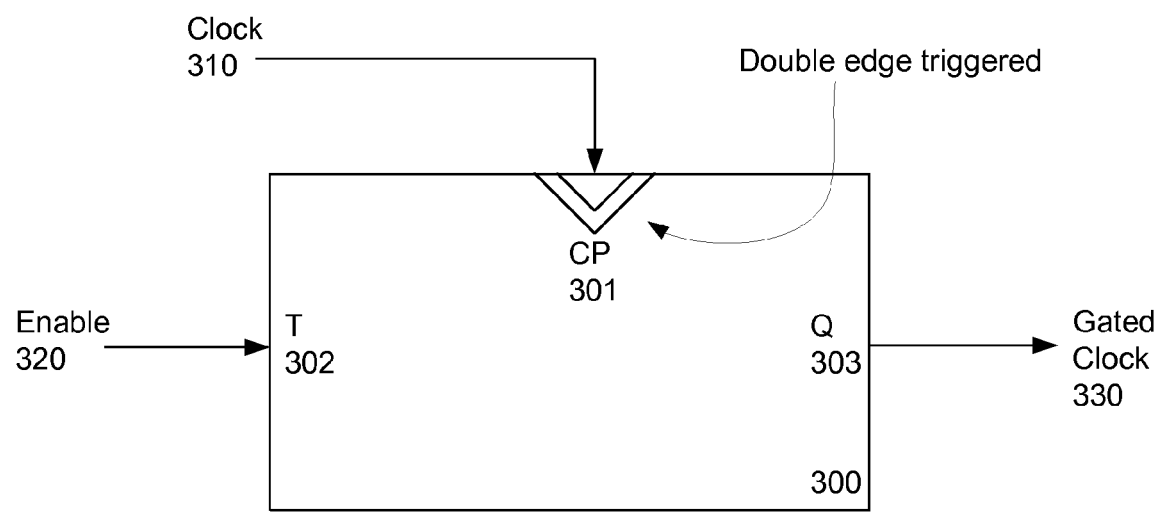
FIG. 5 is a schematic diagram of an exemplary ICG for the DET digital system of FIG. 4 according to an embodiment of the invention.

FIG. 5 is a schematic diagram of an exemplary ICG for the DET digital system of FIG. 4 according to an embodiment of the invention. Referring to FIG. 5, the ICG 300 of FIG. 4 is implemented with a T-type double edge triggered flip-flop 300. The clock signal 310 is provided at the clock input 301 of the flip-flop 300. The enable signal 320 is provided at the T input 302 of the flip-flop 300. The gated clock signal 330 is outputted at the Q output 303 of the flip-flop. When the enable signal 320 is low, the gated clock signal 330 keeps its current value and does not switch. When the enable signal 320 is high, the gated clock signal 330 starts switching on every edge of the incoming clock 310.

Figure 6:
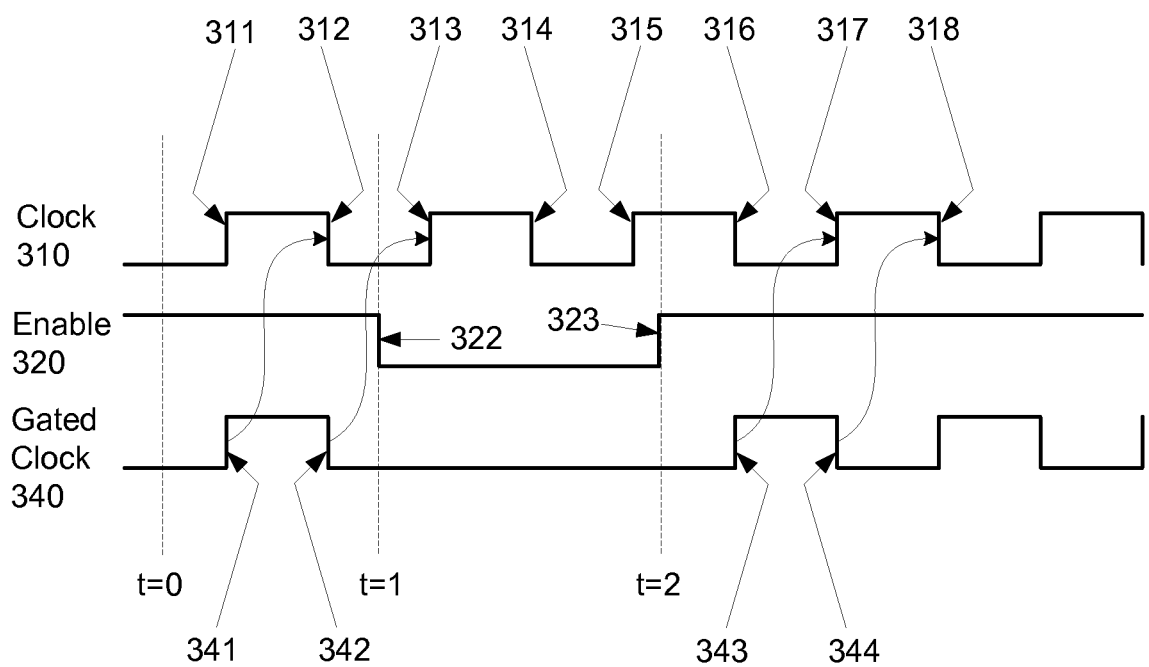
FIG. 6 is a timing diagram showing exemplary waveforms for the ICG of FIG. 5.

FIG. 6 is a timing diagram showing exemplary waveforms for the ICG of FIG. 5. Referring to FIGS. 5 and 6, the clock signal 310 provided at the input of the ICG 300 switches periodically between logic zero and logic one. For example, the clock signal 310 switches periodically from low to high with rising edges 311, 313, 315 and 317, respectively. The clock signal 310 switches periodically from high to low with falling edges 312, 314, 316 and 318, respectively after each corresponding one of the low to high transitions at rising edges 311, 313, 315 and 317.

The enable signal 320 at the input 302 of the T flip-flop of the ICG 300 was initially at logic 1 prior to the time t=0 and remains at logic 1 in the time interval from t=0 to t=1 to enable the ICG 300 to output the gated clock signal 340 at the Q output 303 of the T flip flop therein. Thus, the gated clock signal 340 follows the clock signal 310 in the time interval from t=0 to t=1 with a rising edge 341 following the rising edge 311 of the clock signal 310 and with a falling edge 342 following the falling edge 312 of the clock signal 310.

At a time t=1, the enable signal 320 is switched to low with a falling edge 322 and remains low until a time t=2. Thus, during the time between t=1 and t=2, the T flip-flop of the ICG 300 gates the clock signal at the Q output 303 thereof at a low value in accordance with the state of the gated clock signal 330 at time t=1. Thus, while the clock signal 310 switches back and forth with rising and falling edges 313, 314, respectively, the gated clock signal 330 at the output of the T flip flop in the ICG 300 remains at the logic low value existing therein at the time t=1 when the enable signal 320 switched to low.

At time t=2 shortly after a rising edge 315 of the clock signal 310 the enable signal 320 is switched back to high with a rising edge 323. The gated clock 340 is enabled by the high level of the enable signal 320 and starts switching with the clock signal 310 after the next edge 316 thereof. Thus, the gated clock signal 340 switched from low to high with a rising edge 343 at or shortly after the next edge thereof, e.g. the falling edge 316 of the clock signal 310. Then, the gated clock signal 340 switched from high to low with a falling edge 344 at or shortly after the rising edge 317 of the clock signal 310.

Thus, according to an embodiment of the invention as shown in FIG. 6, the gated clock signal 340 is enabled at time t=0 by the enable signal 320 at logic high. At time t=1, the gated clock signal 340 is disabled and remains at the logic low level according to its state at the time t=1. At time t=2, the gated clock signal 340 is re-enabled at a time when the clock signal 310 is at logic high. Then, the gated clock signal resumes switching from its current value at the next edge of the clock signal following the rising edge of the enable signal. Since the gated clock signal 340 is enabled from a logic low while the clock signal is at logic high, the gated clock signal 340 will start switching with a rising edge 343 when the clock signal has a falling edge 316. Consequently, the resulting gated clock signal 340 is an inverted version of the input clock signal 310.

According to an embodiment of the invention, the polarity of the gated clock signal 340 is inverted from the input clock signal 310 if the gated clock signal 340 remains gated for an odd number of edges of the input clock signal 310. The change in polarity of the gated clock signal will not cause any functional failure because rising and falling edges are functionally equivalent in double edge triggered systems. Since the gated clock can have two data dependent opposite polarities, additional timing checks need to be performed on the circuit during static timing analysis.

Referring to FIGS. 4 and 6, in a first timing check, data is launched by the first DET flip-flop 340 at the rising edge 341 of the gated clock signal. The launched data propagates through the combinational path 360 and is captured by the second DET flip-flop 350 at the following falling edge 312 of the ungated clock signal 310.

In a second timing check, data is launched by the first DET flip-flop 340 at the falling edge 342 of the gated clock signal 340 and propagates through the combinational logic 360 to be captured by the second DEF flip-flop 350 at the following rising edge 313 of the ungated clock.

In a third timing check, data is launched by the first DET flip-flop 340 at the rising edge 343 of the gated clock signal 340 and is captured by the second DET flip-flop 350 at the rising edge 317 of the ungated clock 310 after propagation through the combinational logic 360.

In a fourth timing check, data is launched by the first DET flip-flop 340 at the falling edge 344 of the gated clock 340 and is captured by the second DEF flip-flop 350 at the falling edge 318 of the ungated clock signal 310.

The first and second timing checks correspond to the expected timing checks during the regular operation of double edge triggered systems, without clock gating. The third and fourth timing checks are introduced by an exemplary embodiment of the invention when the gated clock is an inverted version of the input clock. The timing checks can be handled in all situations by existing static timing tools using the notion of clock phases: the output of each ICG is assigned two clock phases with opposite polarities.

Figure 7:
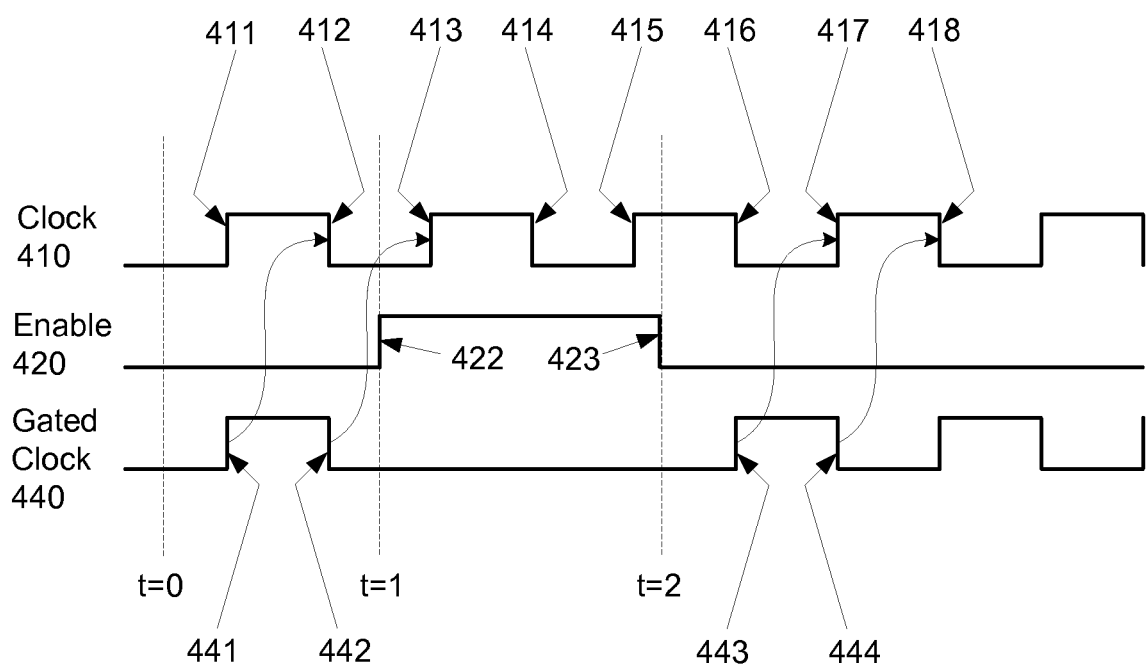
FIG. 7 is a timing diagram showing exemplary waveforms for the ICG of FIG. 5.

FIG. 7 is a timing diagram showing exemplary waveforms for the ICG of FIG. 5. Referring to FIGS. 5 and 7, the clock signal 410 provided at the input of the ICG 300 switches periodically between logic zero and logic one. For example, the clock signal 410 switches periodically from low to high with rising edges 411, 413, 415 and 417, respectively. The clock signal 410 switches periodically from high to low with falling edges 412, 414, 416 and 418, respectively after each corresponding one of the low to high transitions at rising edges 411, 413, 415 and 417.

The enable signal 420 at the input 302 of the T flip-flop of the ICG 300 was initially at logic 0 prior to the time t=0 and remains at logic 0 in the time interval from t=0 to t=1 to enable the ICG 300 to output the gated clock signal 440 at the Q output 303 of the T flip flop therein. Thus, the gated clock signal 440 follows the clock signal 410 in the time interval from t=0 to t=1 with a rising edge 441 following the rising edge 411 of the clock signal 410 and with a falling edge 442 following the falling edge 412 of the clock signal 410.

At a time t=1, the enable signal 420 is switched to high with a rising edge 422 and remains high until a time t=2. Thus, during the time between t=1 and t=2, the T flip-flop of the ICG 300 gates the clock signal at the Q output 303 thereof at a low value in accordance with the state of the gated clock signal 430 at time t=1. Thus, while the clock signal 410 switches back and forth with rising and falling edges 413, 414, respectively, the gated clock signal 430 at the output of the T flip flop in the ICG 300 remains at the logic low value existing therein at the time t=1 when the enable signal 420 switched to high.

At time t=2 shortly after a rising edge 415 of the clock signal 410 the enable signal 420 is switched back to low with a falling edge 423. The gated clock 440 is enabled by the low level of the enable signal 420 and starts switching with the clock signal 410 after the next edge 416 thereof. Thus, the gated clock signal 440 switched from low to high with a rising edge 443 at or shortly after the next edge thereof, e.g. the falling edge 416 of the clock signal 410. Then, the gated clock signal 440 switched from high to low with a falling edge 444 at or shortly after the rising edge 417 of the clock signal 410.

Thus, according to an embodiment of the invention as shown in FIG. 6, the gated clock signal 440 is enabled at time t=0 by the enable signal 420 at logic low. At time t=1, the gated clock signal 440 is disabled and remains at the logic low level according to its state at the time t=1. At time t=2, the gated clock signal 440 is re-enabled at a time when the clock signal 410 is at logic high. Then, the gated clock signal resumes switching from its current value at the next edge of the clock signal following the falling edge of the enable signal. Since the gated clock signal 440 is enabled from a logic low while the clock signal is at logic high, the gated clock signal 440 will start switching with a rising edge 443 when the clock signal has a falling edge 416. Consequently, the resulting gated clock signal 440 is an inverted version of the input clock signal 410.

Figure 8:
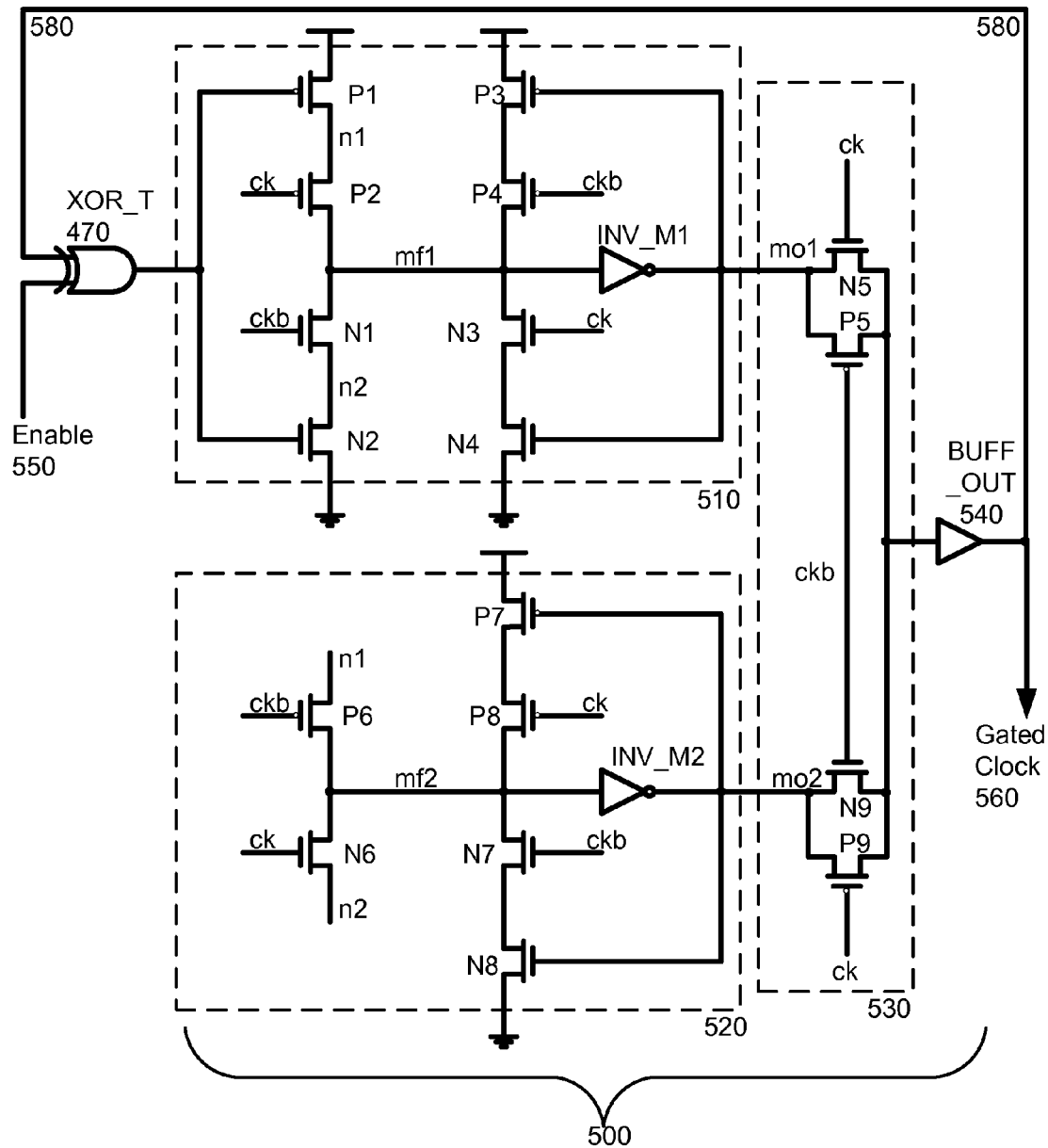
FIG. 8 shows an exemplary CMOS implementation of an ICG for a DET digital system according to another embodiment of the invention.

FIG. 8 shows an exemplary CMOS implementation of an ICG for a DET digital system according to another embodiment of the invention. Referring to FIG. 7, a T-type double edge triggered flip-flop is implemented from a D-type double edge triggered flip-flop 500 and an XOR gate 570. The D-type double edge triggered flip-flop 500 is built from a negative latch 510, a positive latch 520, a multiplexer 530 and a buffer 540. The negative latch 510 passes data from its input to its output when the clock signal 590 is low and holds its state when the clock signal is high. In contrast, the positive latch 520 passes data from its input to its output when the clock signal 590 is high and holds its state when clock is low. The negative latch 510 and the positive latch 520, work in parallel, each storing half the data on opposite edges of the clock signal 590. The multiplexer 530 alternates in response to the clock signal 590, selecting the either the positive latch 520 or negative latch 510 according to which latch is currently in the hold state. This ensures that the D-type flip-flop 500 is not transparent from data on the input to data on the output. A buffer 540 on the output compensates for any voltage loss across the multiplexer 530.

To implement the T-type flip-flop, the current output value of the D-type flip-flop 500 is connected through a feedback loop 580 into a first input of the XOR gate 570. Data, in this case an enable signal 550, is connected to a second input of the XOR gate 450. The output of the XOR gate 570 is connected to the input of the D-type flip-flop 500. When the enable signal 550 is low, the gated clock output 560 holds its current value. When the enable signal 550 is high, the gated clock signal 560 switches with each edge of the clock signal 590.

According to an embodiment of the invention, an ICG cell compatible with double edge triggered systems stops the gated clock signal at its last value before being disabled and resumes switching from the last value when enabled. Thus, the waveform of the gated clock signal is the inverse of the input clock signal. However, the double edge triggered circuits will load and transfer data correctly at the clock edges.

Although a clock gating cell which gates the incoming clock signal when the enable signal is low has been shown and described, other embodiments where the incoming clock signal is gated when the enable signal is high are also contemplated.

It will be apparent to those skilled in the art that various modifications and variations can be made in the integrated clock gating cell for use in circuits with double edge triggered flip-flops of embodiments of the invention without departing from the spirit or scope of the invention. Thus, it is intended that embodiments of the invention cover the modifications and variations of this invention provided they come within the scope of the appended claims and their equivalents.

What is claimed is:

1. A double edge triggered circuit, comprising:
   a clock gating cell responsive to a clock signal and an enable signal to output a gated clock signal;
   a first double edge triggered flip-flop that launches a data signal in response to the gated clock signal; and
   a second double edge triggered flip-flop that captures the data signal in response to the clock signal,
   wherein the clock gating cell stops the gated clock signal at a first logic value when the enable signal is at a first logic state, and the clock gating cell switches the gated clock signal from the first logic value at a next clock edge when the enable signal is at a second logic state, wherein the clock gating cell, the first double edge triggered flip-flop, and the second double edge triggered flip-flop are T-type flip flops, wherein the gated clock signal is 180 degrees out of phase from the clock signal.

2. The circuit of claim 1, wherein the first double edge triggered flip-flop is connected to the second double edge triggered flip-flop by a logical path.

3. The circuit of claim 1, wherein the first double edge triggered flip-flop launches on a rising edge of the gated clock signal and the second double edge triggered flip-flop captures on a falling edge of the clock signal.

4. The circuit of claim 1, wherein the first double edge triggered flip-flop launches on a falling edge of the gated clock signal and the second double edge triggered flip-flop captures on a rising edge of the clock signal.

5. The circuit of claim 1, wherein the first double edge triggered flip-flop launches on a rising edge of the gated clock signal and the second double edge triggered flip-flop captures on a rising edge of the clock signal.

6. The circuit of claim 1, wherein the first double edge triggered flip-flop launches on a falling edge of the gated clock signal and the second double edge triggered flip-flop captures on a falling edge of the clock signal.

7. The circuit of claim 1, wherein the first logic state is logic low and the second logic state is logic high.

8. The circuit of claim 1, wherein the first logic state is logic high and the second logic state is logic low.

9. The circuit of claim 1, wherein the clock gating cell holds the gated clock signal at the first logic state while the enable signal is at the second logic state until a clock signal edge is reached, upon reaching the clock signal edge the gated clock signal switches to the second logic state in accordance with the enable signal.

10. The circuit of claim 1, wherein the gated clock signal is 180 degrees out of phase from the clock signal if the gated clock signals remains gated for an odd number of edges of the input clock signal.

11. A double edge triggered circuit, comprising:
a clock gating cell that outputs a control signal that switches at a first falling edge and a first rising edge of a clock signal following a rising edge of an enable signal and holds the control signal at a gated logic level following a falling edge of the enable signal;
a first double-edge triggered flip-flop that launches a first data at a first rising edge of the control signal responsive to the first falling edge of the clock signal and launches a second data at a first falling edge of the control signal responsive to the first rising edge of the clock signal; and
a second double-edge triggered flip-flop that loads the first data at the first rising edge of the clock signal and loads the second data at the next falling edge of the clock signal following to the first rising edge of the clock signal, wherein the clock gating cell, the first double edge triggered flip-flop, and the second double edge triggered flip-flop are T-type flip flops, wherein the gated clock signal is 180 degrees out of phase from the clock signal.

12. The circuit of claim 11, wherein the gating cell includes a T-type double-edge triggered flip-flop that provides the control signal at the Q-output thereof in response to the clock signal at the clock input thereof and the enable signal at the T input thereof.

13. The circuit of claim 11, wherein the first double-edge triggered flip-flop launches a third data at a second rising edge of the control signal responsive to a second rising edge of the clock signal and launches a fourth data at a second falling edge of the control signal responsive to a second falling edge of the clock signal; and the second double-edge triggered flip-flop loads the third data at the second falling edge of the clock signal and loads the fourth data at the next rising edge of the clock signal following the second falling edge of the clock signal.

14. The circuit of claim 11, wherein the clock gating cell holds the control signal at a first logic state while the enable signal is at a second logic state until a clock signal edge is reached, upon reaching the clock signal edge the control signal switches to the second logic state in accordance with the enable signal.

15. The circuit of claim 11, wherein the clock gating cell stops the control signal at the control signal last value before being disabled and resumes switching from the last value when enabled.

16. A method for transferring data in a digital system including a T-type flip-flop responsive to a clock signal at the clock input thereof and an enable signal at the T input thereof to output a control signal, a first double edge triggered flip-flop controlled by the control signal, and a second double edge triggered flip-flop controlled by the clock signal, the method comprising:
changing the enable signal from a low logic level to a high logic level to enable data transfer between the first and second double edge triggered flip-flops;
switching the control signal at a first falling edge and a first rising edge of the clock signal following the changing of the enable signal from the low logic level to the high logic level;
launching a first data from the first double-edge triggered flip-flop at a first rising edge of the control signal in response to the first falling edge of the clock signal;
loading the first data into the second double-edge triggered flip-flop at the first rising edge of the clock signal;
launching a second data from the first double-edge triggered flip-flop at a first falling edge of the control signal in response to the first rising edge of the clock signal;
loading the second data into the second double-edge triggered flip-flop at the next falling edge of the clock signal following the first rising edge of the clock signal;
changing the enable signal from the high logic level to the low logic level;
holding the control signal at a gated logic level following the changing of the enable signal from the high logic level to the low logic level to prevent data transfer between the first and second double edge triggered flip-flops, wherein the first double edge triggered flip-flop, and the second double edge triggered flip-flop are T-type flip flops;
changing the enable signal from the low logic level to the high logic level to enable data transfer between the first and second double edge triggered flip-flops;
switching the control signal at a second rising edge and a second falling edge of the clock signal following the changing of the enable signal from the low logic level to the high logic level;
launching a third data from the first double-edge triggered flip-flop at a second rising edge of the control signal in response to the second rising edge of the clock signal;
loading the third data into the second double-edge triggered flip-flop at the second falling edge of the clock signal;
launching a fourth data from the first double-edge triggered flip-flop at a second falling edge of the control signal in response to the second falling edge of the clock signal; and loading the second data into the second double-edge triggered flip-flop at the next rising edge of the clock signal following the second falling edge of the clock signal.

17. The method of claim 16, wherein switching the control signal further comprises holding the control signal at the low logic level while the enable signal is changed to the high logic level until a clock signal edge is reached, upon reaching the clock signal edge the control signal switches to the high logic level in accordance with the enable signal.

* * * * *